United States Patent [19]

Nakazato et al.

[11] Patent Number: 5,793,611
[45] Date of Patent: Aug. 11, 1998

[54] COOLING DEVICE WITH THERMALLY SEPARATED ELECTRONIC PARTS ON A MONOLITHIC SUBSTRATE

[75] Inventors: Norio Nakazato, Chiba-ken; Shigeki Hirasawa, Ishioka; Shoji Masukawa, Fujisawa; Heikichi Kuwahara, Tsuchiura, all of Japan

[73] Assignee: Hitachi, Ltd., Japan

[21] Appl. No.: 752,009

[22] Filed: Nov. 19, 1996

Related U.S. Application Data

[63] Continuation of Ser. No. 414,957, Mar. 31, 1995, abandoned.

[30] Foreign Application Priority Data

Apr. 5, 1994 [JP] Japan ................................ 6-066881

[51] Int. Cl.$^6$ ...................................................... H05K 7/20
[52] U.S. Cl. ........................ 361/704; 165/104.33; 361/719
[58] Field of Search ....................... 62/259.2; 454/184; 165/122, 126, 80.3, 80.4, 185, 104.33; 174/16.3, 15.2, 252; 257/713–715, 721–724; 361/717–719, 720, 690, 694–698, 699, 700, 703–705, 722

[56] References Cited

U.S. PATENT DOCUMENTS

| | | | |
|---|---|---|---|
| 4,204,246 | 5/1980 | Arii | 361/385 |
| 4,327,399 | 4/1982 | Sasaki | 361/385 |
| 4,858,073 | 8/1989 | Gregory | 361/388 |
| 4,859,520 | 8/1989 | Dubuisson | 428/137 |
| 4,970,868 | 11/1990 | Grebe | 62/51.1 |
| 5,172,301 | 12/1992 | Schneider | 361/386 |
| 5,216,580 | 6/1993 | Davidson | 361/385 |
| 5,280,409 | 1/1994 | Selna | 361/720 |
| 5,283,715 | 2/1994 | Carlsten | 361/702 |
| 5,331,510 | 7/1994 | Ouchi | 361/702 |
| 5,352,991 | 10/1994 | Lipschultz | 330/289 |
| 5,386,143 | 1/1995 | Fitch | 257/715 |
| 5,475,263 | 12/1995 | Coady | 257/700 |

FOREIGN PATENT DOCUMENTS

| | | |
|---|---|---|
| 62-71300 | 4/1987 | Japan . |
| 5-52080 | 8/1993 | Japan . |

OTHER PUBLICATIONS

Two-Phase Thermosyphon Cooling For Telecom Multichip Modules, Tohru Kishimoto and Akio Harada, Advances in Electronic Packaging, ASME 1992, pp. 135–141.

*Primary Examiner*—Gerald P. Tolin
*Attorney, Agent, or Firm*—Evenson, McKeown, Edwards & Lenahan, P.L.L.C.

[57] ABSTRACT

An electronic device comprises a substrate having electronic parts, electric conductive wires for electrically connecting between the electronic parts, a front surface on which the electronic parts and electric conductive wires are mounted, a reverse surface and at least one electronic part back portion opposite to the electronic parts; and at least one high thermal conductivity member, a thermal conductivity coefficient thereof being higher than that of the substrate, the high thermal conductivity member being connected to the electronic part back portion while the high thermal conductivity member is opposite to the electronic parts in a substrate width direction to decrease a difference in temperature between the electronic parts.

25 Claims, 8 Drawing Sheets

COOLING DEVICE WITH THERMALLY SEPARATED ELECTRONIC PARTS ON A MONOLITHIC SUBSTRATE

This application is a continuation of application Ser. No. 08/414,957, filed on Mar. 31, 1995, now abandoned.

BACKGROUND OF THE INVENTION AND RELATED ART STATEMENT

The present invention relates to an electronic device having electronic parts mounted on a substrate.

In a conventional technology disclosed in Japanese Patent Unexamined Publication No. 62-71300, a heat radiator is connected to a surface of a high-heating electronic part through a thermal conductive grease.

In a conventional technology disclosed in Japanese Patent Examined Publication No. 5-52080, a heat energy emitted from upper surfaces of a plurality of heating electronic parts is transferred to a heat radiator by means of a heat pipe.

In a conventional technology disclosed in "Advances in Electronic Packaging" (1992, ASME), on pages 135 to 141, a heat energy emitted from a plurality of heating electronic parts mounted on a surface of a substrate is transferred to a heat radiator by means of a heat pipe provided on a reverse surface of the substrate.

OBJECT AND SUMMARY OF THE INVENTION

An object of the present invention is to provide an electronic device in which operating characteristics of a plurality of electronic parts (for example, logic IC) mounted on a substrate can be maintained at a desired degree.

An electronic device according to the present invention comprises a substrate having electronic parts, electric conductive wires for electrical connection between the electronic parts, a front surface on which the electronic parts and electric conductive wires are mounted, a reverse surface and at least one electronic part back portion opposite to the electronic parts; and at least one high thermal conductivity member, a thermal conductivity coefficient thereof being higher than that of the substrate, the high thermal conductivity member being connected to the electronic part back portion while the high thermal conductivity member is opposite to the electronic parts in a substrate width direction to decrease a difference in temperature between the electronic parts.

Due to the provision of at least one high thermal conductivity member, which has a thermal conductivity coefficient higher than that of the substrate and is connected to the electronic part back portion while being opposite to the electronic parts in the substrate width direction to decrease a difference in temperature between the electronic parts, the operating characteristics of the electronic parts can be prevented from changing variously according to the difference in temperature between the electronic parts and, hence, can be made equal to the desired degree.

The high thermal conductivity member [The high thermal conductivity member is made of high-thermal conductivity metal such as aluminum alloy or copper alloy, or heat pipe. The direction of flow of a cooling medium within the heat pipe may be limited only in one direction (in order to, for example, cause the heat energy to flow from high-temperature or high-heating electronic part to low-temperature or low-heating electronic part, or discharge the heat energy from the electronic part back portion to a heat radiation device), and however, the cooling medium may be allowed to flow in any direction according to the difference in temperature between the electronic parts.] may be connected to the electronic part back portion formed in the substrate (for example, into a hole formed in the substrate) or onto the reverse surface.

If the substrate is monolithic, the monolithic substrate has a plurality of the electronic part back portions, and the electronic device further comprises means for restraining a thermal conduction between the electronic part back portions, a thermal interference between the electronic part pack portions is restrained or prevented regardless of the monolithic substrate, and therefore the operating characteristics of the electronic parts opposite to one of the electronic part back portions can be prevented from being changed by the electronic parts opposite to the other electronic part pack portion. The means for restraining the thermal conduction between the electronic part back portions may be a groove (in which a material having a thermal conductivity coefficient lower than that of the substrate may be embedded) formed on the monolithic substrate, or a groove (in which a material having a thermal conductivity coefficient lower than that of the high thermal conductivity member may be embedded) formed on the high thermal conductivity member. The electronic part back portions may be connected to the high thermal conductivity members respectively, and the means for restraining the thermal conduction between the electronic part back portions may be a space between the high thermal conductivity members.

The electronic device may further comprise a heat radiator for transmitting a heat energy from the high thermal conductivity member to a cooling gas (e.g., the atmospheric air). The electronic device may further comprise a heat transferring member which has a thermal conductivity coefficient higher than that of the high thermal conductivity member to transmit the heat energy from the high thermal conductivity member to the heat radiator. For instance, if the high thermal conductivity member is made of a high thermal conductivity metal such as aluminum alloy or copper alloy and the heat transferring member is made of a heat pipe, a thermal conductivity coefficient of the heat transferring member becomes higher than that of the high thermal conductivity member. If the heat transferring member is opposite to the electronic parts in the substrate width direction and connected to the high thermal conductivity member, an efficiency of heat transfer from the electronic parts to the heat transferring member is increased. If a plurality of the heat transferring members cross each other, the positional relationship between the electronic part back portions and the positional relationship between the heat radiators can be reversed with respect to the direction of flow of the cooling gas.

If a cover is provided between the heat radiator and the reverse surface to prevent the cooling gas from contacting the substrate after the cooling gas is heated by the heat radiator, or if the heat radiator extends obliquely to a cooling gas flow direction to urge the cooling gas away from the substrate after the cooling gas is heated by the heat radiator, the substrate is prevented from being locally heated by the heated cooling gas, as well as the difference in temperature between the electronic parts is prevented from being increased by the heated cooling gas.

If a heater is provided at a downstream side of the heat radiator in a cooling gas flow to heat the cooling gas, the cooling gas flow is accelerated. A radiant energy shelter may be provided between the heater and the heat radiator. If the substrate has a plurality of the electronic part back portions, and the heat radiator for the high thermal conductivity member connected to one of the electronic part back portions is arranged over another one of the electronic part back portions, the positional relationship between the electronic part back portions and the positional relationship between the heat radiators can be reversed in the cooling gas flow direction.

If maximum allowable temperatures of the electronic parts opposite to the electronic part back portion in the substrate width direction are substantially identical with each other, the electronic parts can be used at temperatures approximate to those maximum allowable temperatures. If preferable operating temperatures (that is, temperature ranges) of the electronic parts opposite to the electronic part back portion in the substrate width direction are substantially identical with each other, the electronic parts can be used with the same good operating characteristics.

It is preferred that a heat conductive direction in the high thermal conductivity member is prevented from being limited to one direction, in order to reduce the difference in temperature between the electronic parts. If the high thermal conductivity member is connected to the electronic parts through the substrate, the heat energy generating from the electronic parts is directly transmitted to the high thermal conductivity member to further reduce the difference in temperature between the electronic parts.

DETAILED DESCRIPTION OF PREFERRED EMBODIMENTS

Figure 1:
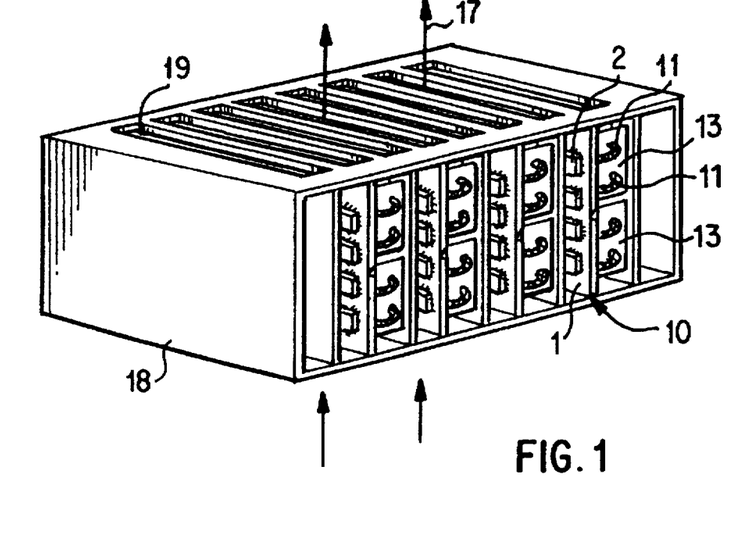
FIG. 1 is a perspective view of a unit in which electronic circuit packages of the present invention are mounted.
Figure 2:
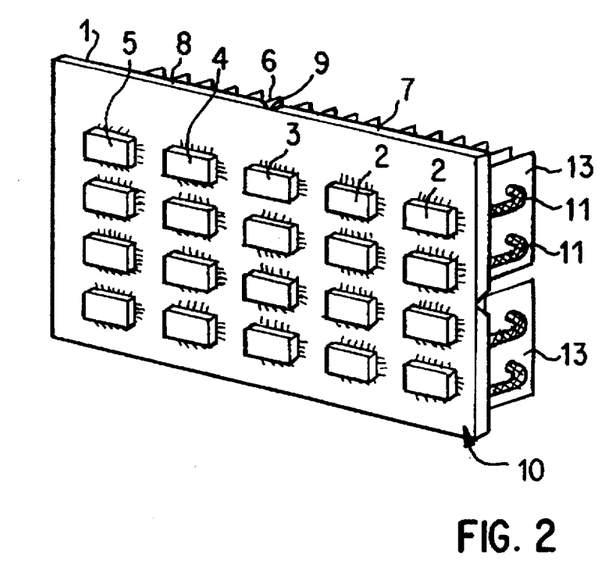
FIG. 2 is a perspective view of an electronic circuit package with heat radiator according to the present invention as viewed from a substrate side thereof.
Figure 3:
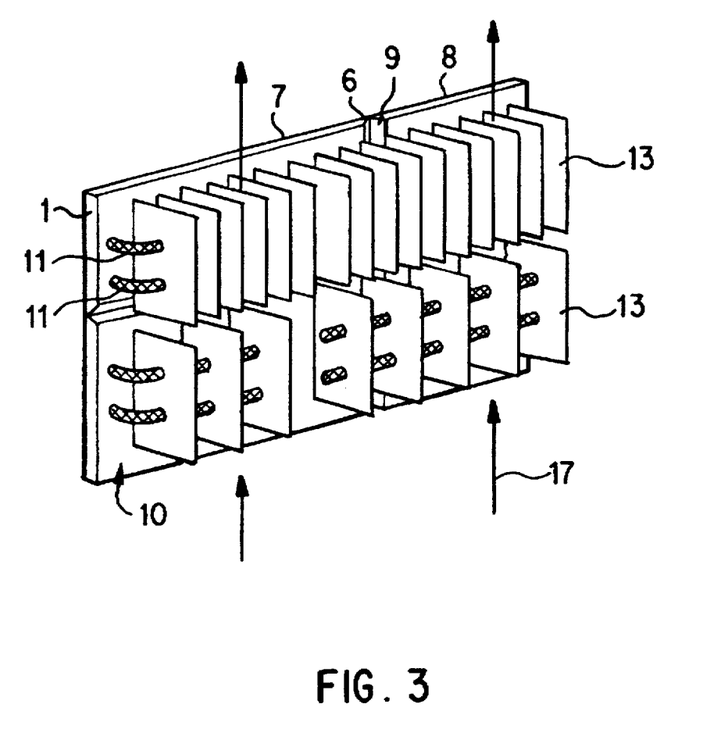
FIG. 3 is a perspective view of the electronic circuit package with heat radiator according to the invention as viewed from a heat radiator side thereof.

A preferred embodiment of the present invention will be described hereunder with reference to FIGS. 1 to 8. FIG. 1 is a perspective view of a unit in which electronic circuit packages having heat radiator are arranged. FIG. 2 is a perspective view of the electronic circuit package with heat radiator as viewed from a substrate side thereof, FIG. 3 is a perspective view of the electronic circuit package with heat radiator as viewed from a heat radiator side thereof, FIGS. 4, 5, 6 and 8 are top views showing electronic circuit packages with heat radiator respectively, and FIG. 7 is a front view of an electronic circuit package with heat radiator as viewed from a heat radiator side thereof.

Electronic circuit packages 10 are vertically set within an electronic device unit 18 as shown in FIG. 1, and cooling air is made to flow in the direction shown by arrow marks 17.

Figure 4:
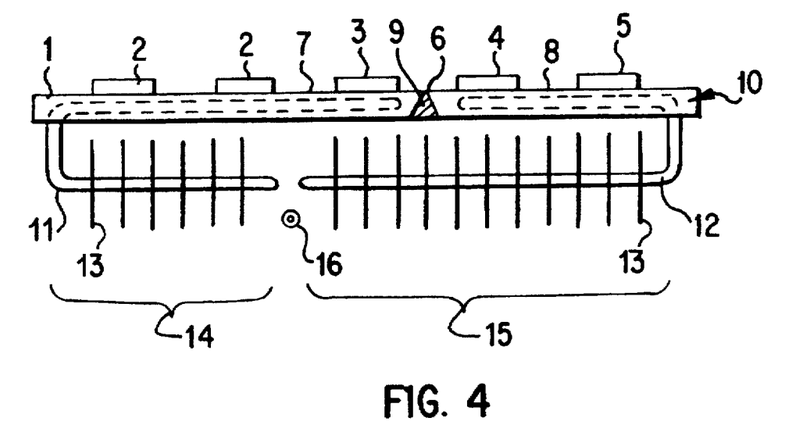
FIG. 4 is a top view of the electronic circuit package of the invention.

The unit of this embodiment is constructed as in the following. The electronic circuit package 10 comprises a substrate 1 (made of plastic, ceramic or other material), and electronic parts 2 having transistors and so on and heating when charged with electricity, and wires for electrically connecting between the electronic parts, which are mounted on the substrate 1. The electronic circuit packages 10 are detachably set in a casing 18. On a surface of the substrate 1 opposite to the surface on which the electronic parts 2 are mounted, high thermal conductivity members 11 (described later) are mounted. The high thermal conductivity members 11 are provided with fins 13. Slits 19 are formed in upper and lower surfaces of the casing 18. The air in the casing 18 is heated by the heat radiated from the radiation fins 13 to the ambient air, and the heated air flows vertically due to natural convection. At the same time, fresh air flows into the casing 18 through the slits 19 in the lower surface to introduce cold air from outside, passes through the fins 13 while cooling the fins 13, and then flows out through the slits 19 in the upper surface. In case of requiring a larger amount of air, air is delivered by a blower (not shown) or the like. Next, the electronic circuit package 10 will be described in detail. The electronic circuit package 10 has the following construction as shown in FIGS. 2, 3 and 4. On the substrate 1 are mounted low-heating parts 2, 3 and high-heating parts 4, 5. In the present embodiment, the monolithic substrate 1 is divided by a low thermal conductive region 6 into a heat conductive region 7 in which the low-heating parts 2, 3 are mounted and a heat conductive region 8 in which the high-heating parts 4, 5 are mounted. Holes for fitting the high thermal conductivity members 11, 12, which will be described next, are formed in the heat conduction regions 7, 8 of the substrate 1 so as to extend from the end portions of the substrate 1 toward the low thermal conductive region 6 respectively, and the high thermal conductivity members 11, 12 are fitted in these holes. It is noted that, in the embodiment shown in FIG. 4, the high thermal conductivity members 11, 12 are having U-shaped bent portions are received in passages which include electronic part back portions formed in the substrate. The holes formed in the substrate 1 are opened at the end portions of the substrate 1, and one ends of the high thermal conductivity members 11, 12 are inserted into the holes from the end portions of the substrate 1 and pressed in toward the inner part until they are fixed. The high thermal conductivity members 11, 12 may be connected to the substrate 1 by adhesive.

The high thermal conductivity member is preferably made of, for example, a heat pipe, copper or aluminum, which may be used independently or in combination of copper and aluminum.

A plurality of the radiation fins 13 are provided at that portion of each of the high thermal conductivity members 11, 12 which is not covered with the substrate 1, so as to extend substantially perpendicularly to the longitudinal axis of the high thermal conductivity member while keeping away from the wiring, thereby forming heat radiators 14, 15 for emitting heat. The air flows along the fins 13. The heat radiators 14, 15 are arranged in parallel and adjacent relation to the substrate 1 as shown in FIGS. 3, 4. The heat radiator 15 for cooling the high-heating electronic parts 4, 5 is larger than the heat radiator 14 for cooling the low-heating electronic parts 2, 3.

The operation of the electronic device having such construction will be described. As the electronic device is operated, a heat energy emitted from the electronic parts 2, 3, 4, 5 is transmitted to the substrate 1 from which it is transmitted through the high thermal conductivity members 11, 12 to the radiation fins 13. The radiation fins 13 are cooled by the air flowing around them. In case of cooling the electronic device by natural air-cooling, the air around the radiation fins 13 is warmed by the heat emitted from the radiation fins 13, and the warmed air flows in the vertical direction 16 due to natural convection to introduce cold air from the outside. This flow of air serves to cool the radiation fins 13.

In the present embodiment, the heat conductive region 7 in which the low-heat-generating electronic parts 2, 3 are mounted is thermally separated from the heat conductive region 8 in which the high-heat-generating electronic parts 4, 5 are mounted by means of the low thermal conductive region 6. Owing to the provision of the low thermal conductive region 6, heat can be restrained from being transferred through the substrate 1. Accordingly, a thermal influence between the electronic parts is minimized, and the low-heat-generating electronic parts 3 and the high-heat-generating electronic parts 4 can be arranged on the substrate 1 in closer relation to each other than conventional.

In order to ensure the strength against breaking of the substrate 1, a low thermal conductivity member 9 may be embedded in the substrate 1 to form the low thermal conductive region 6.

Further, the heat radiators 14, 15, which can release the heat energy in amounts corresponding to the mounts of heat energy generating from the heat conductive regions 7, 8 respectively, are connected to the heat conductive regions 7, 8, and therefore parts-packaging densities in the heat conductive regions 7, 8 can be changed or increased independently of each other. For instance, in case of mounting two kinds of heating electronic parts, whose allowable temperatures are 80° C. and 50° C., on the substrate 1 at an ambient temperature of 40° C., if the substrate is divided by the low thermal conductive region into a heat conductive region in which the electronic parts of an allowable temperature of 80° C. be arranged and a heat conductive region in which the electronic parts of an allowable temperature of 50° C. be arranged, the number of the mounted electronic parts of the allowable temperature of 80° C. can be trebled without changing the number of the mounted electronic parts of the allowable temperature of 50° C. Moreover, by making smaller the heat radiator for the electronic parts of the allowable temperature of 80° C. while making larger the heat radiator for the electronic parts of the allowable temperature of 50° C., the number of the electronic parts, mounted in the heat conductive region in which the electronic parts of the allowable temperature of 50° C. be mounted, can be increased.

Since the substrate 1 and the heat radiators 14, 15 are constructed as a unit, it is easy to attach and detach them to and from a main frame. It is noted that, when the high thermal conductivity members 11, 12 are made of the heat pipes, heat transport is effected between a vaporization portion and a condensation portion within the heat pipe, and therefore a cooling efficiency is further enhanced. In case that a plurality of heat pipes are connected to one heat conductive region, the reliability can be increased even if one of the heat pipes breaks down.

Figure 5:
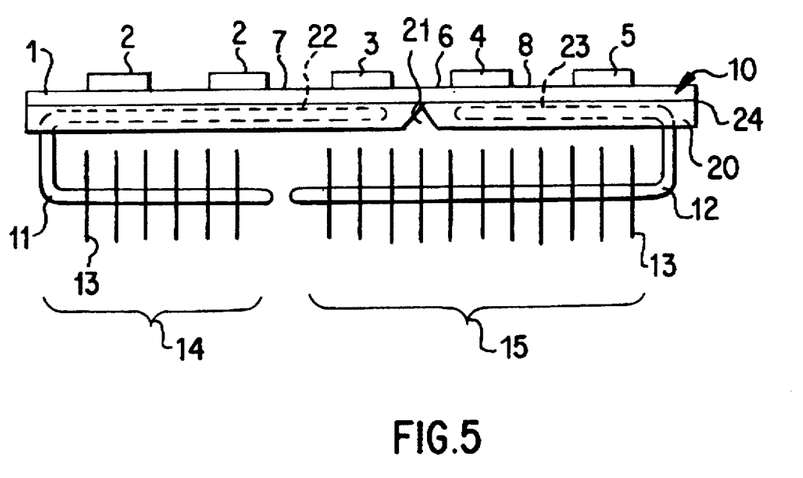
FIG. 5 is a top view of another electronic circuit package with heat radiator according to the invention.

FIG. 5 shows a modification of the embodiment shown in FIGS. 2 to 4. As shown in FIG. 5, the low thermal conductive region 6 may be formed in such a manner that a high thermal conductive radiator block 20, as the hereinafter claimed high thermal conductivity member; made of copper, aluminum or the like, is fixed to the reverse surface parts 202 as the hereinafter claimed electronic part back portions which have no electronic parts mounted thereon, and a groove 21 is formed in the radiator block 20. In this embodiment, the substrate 1 is thermally connected to the radiator block 20 through a grease 24 containing a high thermal conductivity material. The heat generating from the electronic parts 2, 3, 4, 5 is transferred through the grease to the substrate 1 to make a thermal conductivity coefficient of the radiator block 20 higher than that of the substrate 1, and therefore the heat energy is absorbed by the radiator block 20 while being prevented from diffusing into the substrate 1, and is then transmitted mainly through the high thermal conductivity members 11, 12 to the radiation fins 13 where the heat is released. With such construction, the electronic circuit package 10 and the radiator block 20 can be easily attached and detached, and therefore the maintenance becomes easy. By providing heat transmitting studs made of a high thermal conductivity material to extend through the substrate 1 while being in contact with both the heating electronic parts 2, 3, 4, 5 and the radiator block 20, a mutual thermal interference between the heating electronic parts can be reduced, so that the cooling efficiency can be further improved. In case that the heat conduction can not be suppressed as low as sufficient through the substrate 1 only by providing the low thermal conductive region in the radiator block 20, the low thermal conductive region 6 may be provided also in the substrate 1.

Figure 6:
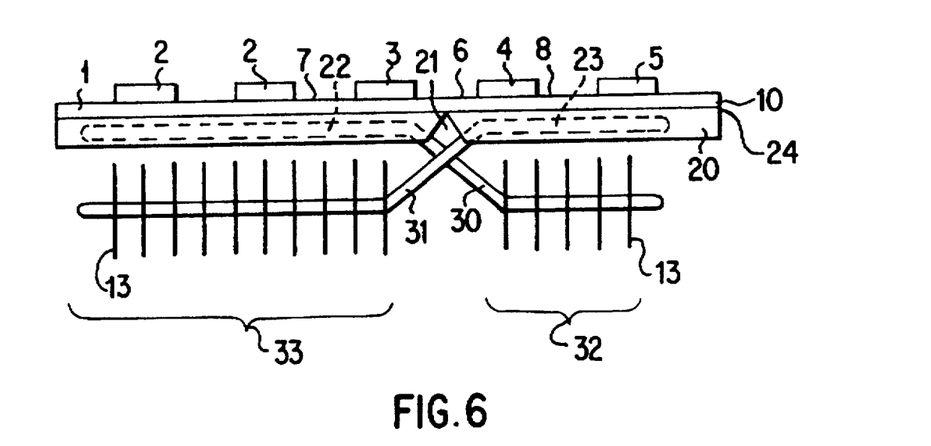
FIG. 6 is a top view of another electronic circuit package with heat radiator according to the invention.
Figure 7:
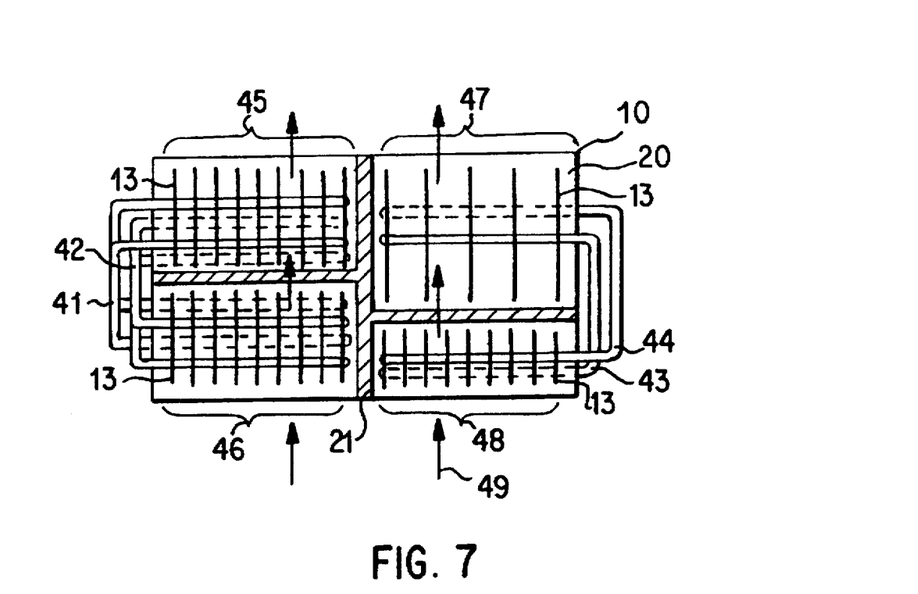
FIG. 7 is a front view of another electronic circuit package with heat radiator according to the invention as viewed from a heat radiator side thereof.

FIG. 6 shows a modification of the embodiment of FIG. 5. Referring to FIG. 6, high thermal conductivity members 30, 31 are inserted into the radiator block 20 through the groove 21 from the positions in the vicinity of the low thermal conductive region 6 located at the central portion of the substrate 1, instead of being inserted from the positions in the vicinity of the end portions of the substrate 1 as shown in FIG. 5, and are crossed each other. More specifically, a heat radiator 32 for a heat conductive region 22 of the substrate 1 is provided over a heat conductive region 23 while a heat radiator 33 for the heat conductive region 23 is provided over the heat conductive region 22. With such construction, the radius of curvature of the bent portions of the high thermal conductivity members 30, 31 is kept large, and therefore the workability can be improved. Further, since the high thermal conductivity members 30, 31 can be used in a shape relatively similar to a straight line, when the high thermal conductivity members are made of the heat pipes, the heat transport efficiency of the heat pipes is enhanced so that the cooling efficiency can be improved.

FIG. 7 shows an embodiment in which heat radiators are arranged in consideration of the direction of flow of the air. In this embodiment, high thermal conductivity members 41 and 42 (for heat radiators 45 and 46 respectively), as well as high thermal conductivity members 43 and 44 (for heat radiators 47 and 48 respectively), are crossed each other in the same manner as shown in FIG. 6 while extending in the direction of flow of the air. However, only one of the pairs of the high thermal conductivity members 41, 42 and 43, 44 may be constructed in this way as occasion demands.

With the above construction, the air flows in the direction shown by arrow marks 49, and therefore the heat radiators 46, 48 located at an upstream side of the flow (at a lower side in this embodiment) are cooled by cold air to improve the cooling efficiency, and accordingly the temperature of the substrate 1 connected to the heat radiators 46, 48 can be lowered.

By interchanging the vertical positions of the heat radiators 47, 48 as shown in FIG. 6, the degree of freedom becomes larger in setting the temperature of substrate 1. For instance, if the temperature of the substrate 1 is so set as to cause the temperature of the electronic parts to approach the upper limit of the allowable temperature the parts-packaging density of the whole electronic circuit package 10 can be increased. With respect to a special electronic part such as bipolar, the temperature of the substrate 1 can be so set as to be in a temperature range appropriate for the operation of the special electronic part.

Figure 8:
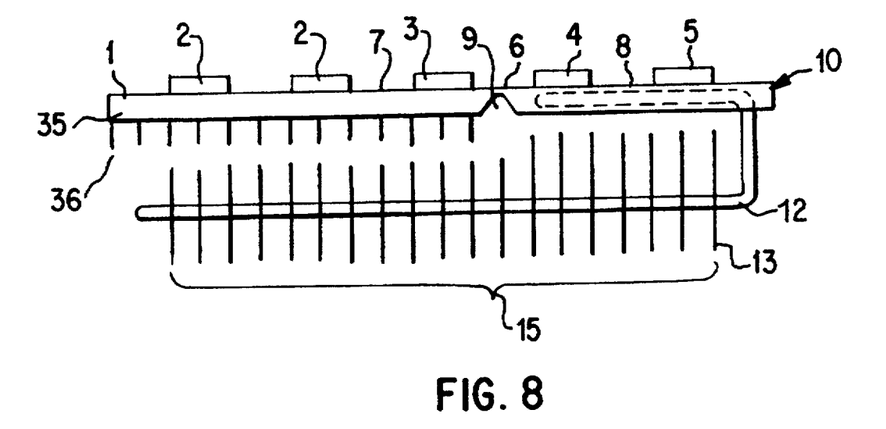
FIG. 8 is a top view of another electronic circuit package with heat radiator according to the invention.

FIG. 8 shows an embodiment in which radiation fins 36 for cooling the low-heat-generating electronic parts 2, 3 are directly attached to a substrate 35 whereas the high-heat-generating parts 4, 5 cooled by the high thermal conductivity member 12. Also in this embodiment, the low thermal conductive region is formed by the groove 9 to divide into the heat conductive regions 7, 8. With such construction, the heat radiator 15 can be extended over the radiator fins 36, so that the heat radiator 15 is enlarged and hence the high-heating electronic parts can be cooled sufficiently. Moreover, since the structure is simplified, production can be performed more easily and at a relatively low cost.

Figure 9:
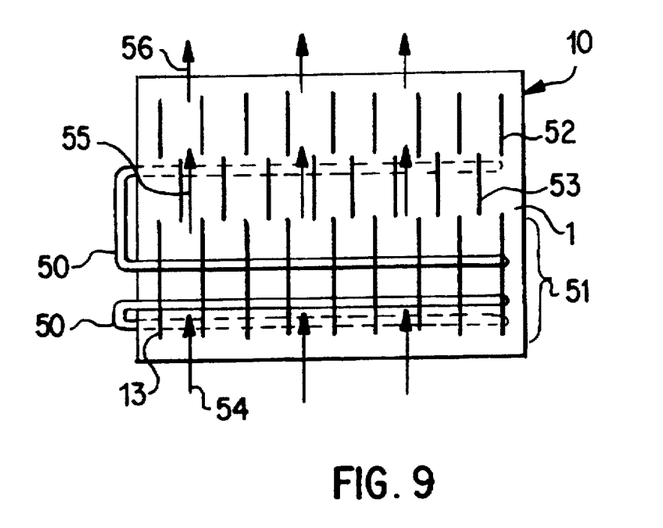
FIG. 9 is a front view of another electronic circuit package of the invention as viewed from a heat radiator side thereof.

Another embodiment of the electronic device of the present invention will be described with reference to FIG. 9. FIG. 9 is a front view of an electronic circuit package as viewed from one side of the substrate 1 on which a heat radiator is provided.

The substrate 1 of the electronic circuit package 10 (or the radiator block disposed on the substrate 1 as described in connection with FIGS. 5, 6) and the heat radiator 51 are thermally connected to each other by a high thermal conductivity member 50. A heater 52 is provided at a downstream side (at an upper side in FIG. 9) of the heat radiator 51 with respect to the air flow 54. A radiant energy shelter 53 (made of stainless steel or the like) is provided between the heat radiator 51 and the heater 52. The radiant energy shelter 53 intercepts the radiant heat released from the heater 52 to prevent the temperature of the radiation fins 13 of the heat radiator 51 from being increased. With such construction, in case of the natural air-cooling, the air warmed by the radiation fins 13 of the heat radiator 51 moves upward so that it is further warmed by being heated within the heater 52, and therefore the specific gravity of the air is further reduced to thereby increase the velocity of the air flow 54. As a result, the cooling efficiency of the electronic circuit package 10 is enhanced. Even if the radiant energy shelter 53 is not provided, the cooling effect can be attained by adjusting the heating by the heater 52, and however, the provision of the radiant energy shelter 53 shows a greater cooling effect.

Other embodiments of the electronic device of the present invention will be described by referring to FIGS. 10 to 13. FIGS. 10 to 13 are vertical sectional views of electronic circuit packages provided with heat radiators respectively.

Figure 10:
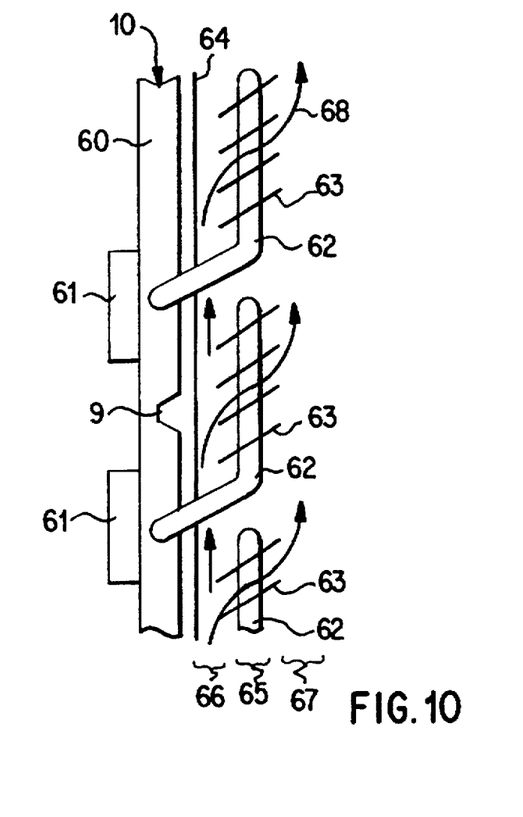
FIG. 10 is a side view of another electronic circuit package according to the invention.

In the embodiment shown in FIG. 10, one ends of high thermal conductivity members 62 are inserted into a substrate 60 at the positions where electronic parts 61 are mounted, and the high thermal conductivity members 62 are each bent in a L-letter shape as shown in FIG. 10 so that the other ends thereof are located at a downstream side (at an upper side in this embodiment) with respect to the air flow. Each of the high thermal conductivity members 62 is provided with radiation fins 63 of a plane parallel plate form. The radiation fins 63 are each inclined with respect to the direction of flow of the air so that an outer portion thereof remote from the substrate 60 (or the portion which does not face on the substrate 60) is located at a downstream side of the air flow, that is, at a higher level, thereby forming a heat radiator 65. A heat cover 64, preferably made of stainless steel or the like, is provided between the heat radiator 65 and the substrate 60 of the electronic circuit package 10 (or the radiator block disposed on the substrate as explained in connection with FIGS. 5, 6). An air passage 66 is formed between the heat radiator 65 and the heat cover 64, while an air passage 67 is formed on the other side of the heat radiator 65 which does not face on the air passage 66. Air paths are formed between the radiation fins 63 so that the air flows from the air passage 66 to the air passage 67 as shown by arrow marks 68 in FIG. 10.

Due to the provision of the heat cover 64, the air flowing substantially in parallel relation to the substrate 60 is prevented or restrained from reaching or coming in contact with the substrate 60 of the electronic circuit package 10, whereas it can reach the radiation fins at the downstream side of the air flow to cool the same. As a result, the warmed air flows at a distance from the substrate 60, so that the cooling efficiency of the electronic circuit package 10 can be improved. Further, the length of the fins can be made shorter as compared with the case where the radiation fins are vertically arranged, and therefore the width required for setting the electronic circuit package in the unit can be made smaller.

Figure 11:
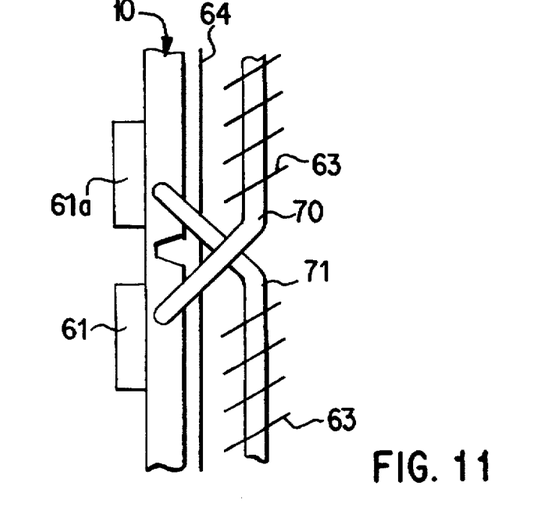
FIG. 11 is a side view of another electronic circuit package with heat radiator according to the invention.

In the embodiment shown in FIG. 11, the high thermal conductivity members are crossed each other as shown in FIG. 6, and a heat radiator 70 for the upper electronic parts 61a is arranged at the position lower than that of a heat radiator 70 for the lower electronic parts 61. With such construction, the electronic parts 61a can be cooled by colder air, and therefore in case that the electronic parts 61a are high-heat-generating ones, a temperature distribution in the electronic circuit package 10 can be allowed to become nearly uniform. The heat radiator may also be constructed such that the substrates 1 are connected to both sides of the radiator block 20, a plurality of high thermal conductivity members 80 are inserted into the radiator block 20, the high thermal conductivity members 80 are connected to a radiator base plate 81, and the radiator base plate 81 is provided with radiation fins 82. It is noted that since the substrates 1 are connected to the both sides of the radiator block 20, the packaging density of the electronic device can be increased. Further, in case that the high thermal conductivity members 80 are made of the heat pipes, since the heat pipes are operated in parallel, even if one of the heat pipes breaks down, the other remaining heat pipes can be operated, and therefore the reliability is enhanced.

Figure 12:
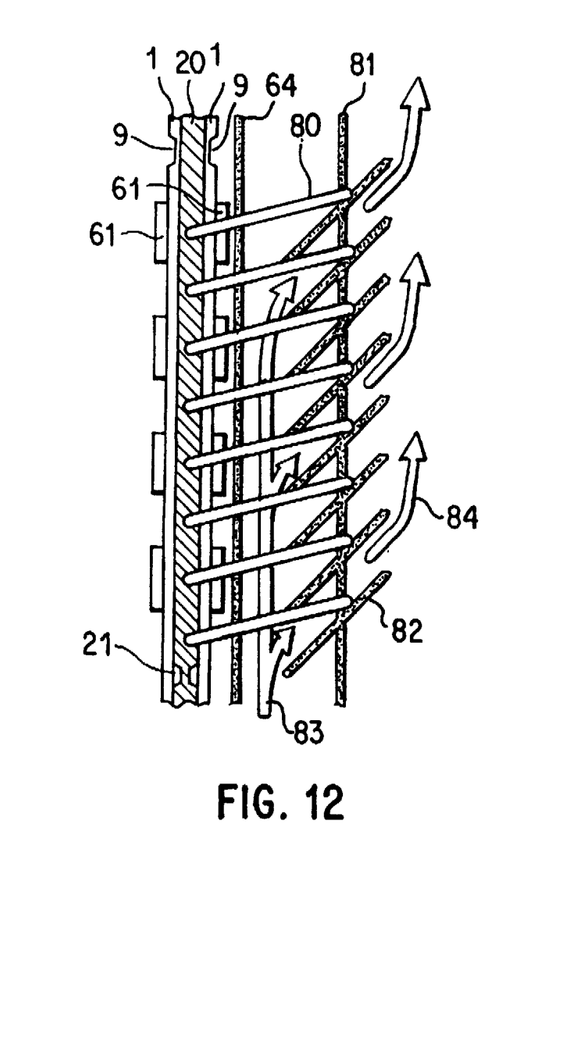
FIG. 12 is a side view of another electronic circuit package with heat radiator according to the invention.
Figure 13:
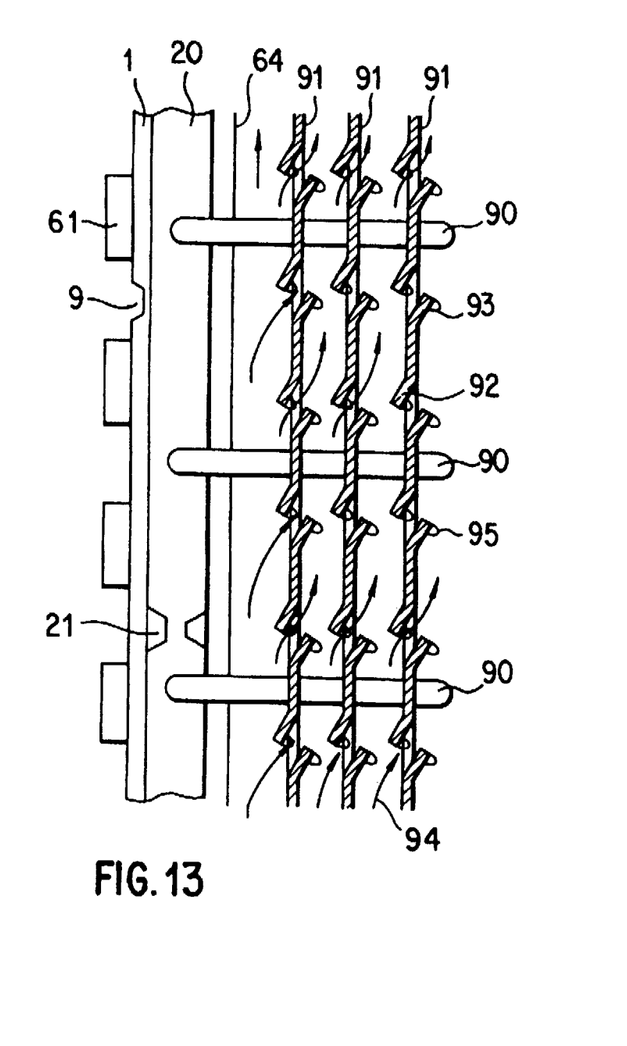
FIG. 13 is a side view of another electronic circuit package with heat radiator according to the invention.
Figure 14:
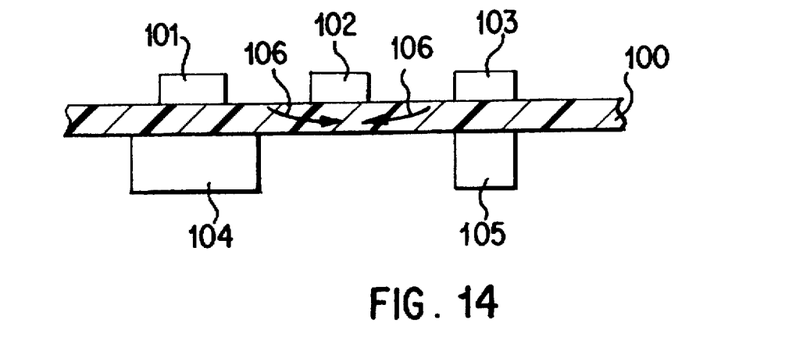
FIG. 14 is a side view of a conventional electronic circuit package.

The radiation fins 82 and the radiator base plate 81 shown in FIG. 12 may be reconstructed as shown in FIG. 13. In the embodiment shown in FIG. 13, radiator base plates 91 are formed thereon with radiation fins 92, 93 by press work, and these radiation fins are attached to a plurality of high thermal conductivity members 90 whose one ends are embedded in the radiator block 20, thereby forming a heat radiator. As shown in FIG. 13, these radiation fins are so shaped as to cause the air, flowing through between the heat cover 64 and the radiator base plate 91 and through between the radiator base plates 91, to flow outwardly in succession to go away from the radiator block 20, and therefore the air flows as shown by arrow marks 94. Owing to such construction, production is simplified. If projections are formed on the radiation fins 92, 93 to cause turbulence in the air flow, the radiation efficiency of the radiation fins is improved, and hence the cooling efficiency of the electronic circuit package can be increased. The projections 95 serve to throw the direction of flow of the air into confusion to effectively enhance the efficiency of heat exchange between the radiator base plates and the cooling gas.

It goes without saying that the structures described in connection with FIGS. 10 to 13 can be applied to the embodiments shown in FIGS. 1 to 8.

Figure 15:
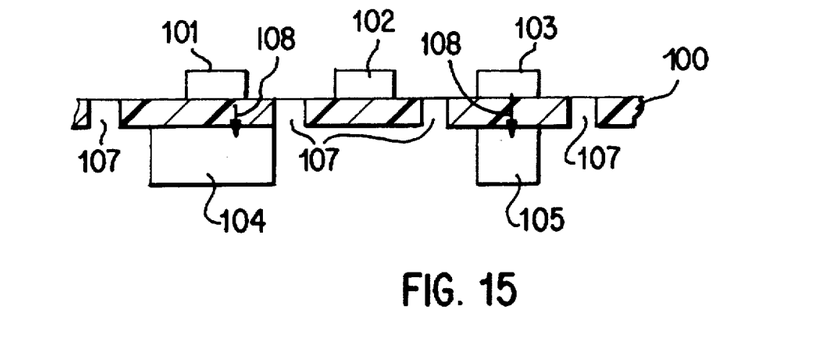
FIG. 15 is a side view of another electronic circuit package according to the invention.

In another embodiment of the present invention shown in FIG. 15, low thermal conductive regions 107 are arranged in a substrate 106 of the electronic circuit package so that a conduction of heat to an electronic part 102 through the substrate can be cut off, and therefore a thermal interference from the electronic parts 101, 103 can be reduced. For this reason, heat radiators 104, 105 can be provided in response to the allowable temperatures of the respective electronic parts, regardless of the allowable temperature of the electronic part 102.

What is claimed is:

1. An electronic device, comprising:
    a monolithic substrate, electronic parts configured to be mounted on the substrate, electric conductive wires operatively associated with the electronic parts, the substrate having a front surface on which the electronic parts and electric conductive wires are mounted, a reverse surface and a plurality of electronic part back portions, each of which portions is in opposition to the electronic parts in a thickness direction of the substrate and is formed on at least one of the reverse surface and an inside of the substrate,
    at least one high thermal conductivity member having a thermal conductivity coefficient higher than that of the substrate and being mounted on at least one of the electronic part back portions to decrease a temperature difference between the electronic parts opposite to at least one of the electronic part back portions, and means arranged between the electronic part back portions under the front surface for restraining thermal interference between the electronic part back portions such that operating characteristics of selected ones of the electronic parts opposite to the at least one electronic part back portions with the decreased, temperature difference are unchanged by remaining ones of the electronic parts.

2. An electronic device according to claim 1, wherein the high thermal conductivity member is connected to the electronic part back portion formed in the substrate.

3. An electronic device according to claim 1, wherein the high thermal conductivity member is connected to the electronic part back portion formed on the reverse surface.

4. An electronic device according to claim 1, wherein the means for restraining the thermal conduction between the electronic part back portions is a groove extending along at least one of the front surface and the reverse surface on the monolithic substrate.

5. An electronic device according to claim 1, wherein the means for restraining the thermal conduction between the electronic part back portions is a groove formed on the high thermal conductivity member.

6. An electronic device according to claim 1, wherein the at least one high thermal conductivity member comprises a plurality of high thermal conductivity members operatively connected to the electronic part back portions, and the restraining means is a space between each of the high thermal conductivity members.

7. An electronic device according to claim 1, further comprising a heat radiator for transmitting a heat energy from the high thermal conductivity member to a cooling gas.

8. An electronic device according to claim 7, further comprising at least one heat transferring member, a thermal conductivity coefficient of the heat transferring member being higher than that of the high thermal conductivity member to transmit the heat energy from the high thermal conductivity member to the heat radiator.

9. An electronic device according to claim 8, wherein the heat transferring member is opposite to the electronic parts in the substrate width direction and connected to the high thermal conductivity member.

10. An electronic device according to claim 8, wherein a plurality of the heat transferring members are staggered with respect to each other.

11. An electronic device according to claim 7, further comprising a cover extending parallel to the reverse surface between the heat radiator and the reverse surface to prevent the cooling gas from contacting the substrate after the cooling gas is heated by the heat radiator.

12. An electronic device according to claim 7, wherein the heat radiator extends obliquely to a cooling gas flow direction to urge the cooling gas away from the substrate after the cooling gas is heated by the heat radiator.

13. An electronic device according to claim 7, further comprising a heater at a downstream side of the heat radiator in a cooling gas flow direction heat the cooling gas.

14. An electronic device according to claim 13, further comprising a radiant energy shelter between the heater and the heat radiator.

15. An electronic device according to claim 7, comprising a plurality of the electronic part back portions, the heat radiator for the high thermal conductivity member connected to one of the electronic part back portions being arranged over another one of the electronic part back portions.

16. An electronic device according to claim 1, wherein the electronic parts are configured such that maximum allowable temperatures of the electronic parts opposite to the electronic part back portions in the substrate width direction are substantially identical with each other.

17. An electronic device according to claim 1, wherein the high thermal conductivity member is configured such that a heat conductive direction thereon is multi-directional.

18. An electronic device according to claim 1, wherein the electronic parts are configured such that operating temperatures thereof opposite to the at least one electronic part back portion in the substrate width are substantially identical with each other.

19. An electronic device according to claim 1, wherein the high thermal conductivity member is connected to the electronic parts through the substrate.

20. An electronic device according to claim 1, wherein the means for restraining the thermal conduction arranged between the electronic part back portions under the electronic parts extends between the electronic parts to divide the monolithic substrate into the plurality of the electronic part back portions viewed in the substrate width direction.

21. An electronic device according to claim 1, wherein the electronic device comprises a plurality of heat transferring members for transmitting a heat energy from the high thermal conductivity member to a cooling gas, a thermal conductivity coefficient of the heat transferring members being higher than that of the high thermal conductivity member, and the means for restraining the thermal conduction arranged between the electronic part back portions under the electronic parts extends between the heat transferring members to divide the monolithic substrate into the plurality of the electronic part back portions, as seen in the substrate width direction.

22. An electronic device according to claim 1, wherein the electronic device comprises a plurality of the high thermal conductivity members, and the means for restraining the thermal conduction arranged between the electronic part back portions under the electronic parts extends between the high thermal conductivity members to divide the monolithic substrate into the plurality of the electronic part back portions as viewed in the substrate width direction.

23. An electronic device according to claim 1, wherein the high thermal conductivity member is mounted on each of the electronic part back portions.

24. An electronic device according to claim 1, comprising a plurality of the high thermal conductivity members mounted on the electronic part back portions respectively.

25. An electronic device according to claim 1, wherein a temperature difference between the electronic parts opposite to the at least one of the electronic part back portions is decreased via the high thermal conductivity member.

* * * * *